(12) United States Patent
Chan et al.

(10) Patent No.: US 8,299,535 B2
(45) Date of Patent: Oct. 30, 2012

(54) DELTA MONOLAYER DOPANTS EPITAXY FOR EMBEDDED SOURCE/DRAIN SILICIDE

(75) Inventors: Kevin K. Chan, Staten Island, NY (US); Abhishek Dube, Fishkill, NY (US); Judson R. Holt, Wappingers Falls, NY (US); Jeffrey B. Johnson, Essex Junction, VT (US); Jinghong Li, Poughquag, NY (US); Dae-Gyu Park, Poughquag, NY (US); Zhengmao Zhu, Poughkeepsie, NY (US)

(73) Assignee: International Business Machines Corporation, Armonk, NY (US)

(*) Notice: Subject to any disclaimer, the term of this patent is extended or adjusted under 35 U.S.C. 154(b) by 306 days.

(21) Appl. No.: 12/823,163

(22) Filed: Jun. 25, 2010

(65) Prior Publication Data

US 2011/0316044 A1 Dec. 29, 2011

(51) Int. Cl.
*H01L 29/78* (2006.01)
*H01L 21/336* (2006.01)
*H01L 21/762* (2006.01)
*H01L 21/8234* (2006.01)
*H01L 21/8238* (2006.01)

(52) U.S. Cl. ........ 257/368; 257/369; 257/382; 257/384; 257/408; 257/615; 257/E29.255; 257/E29.266; 257/E21.409; 257/E21.619; 257/E21.562; 257/E21.634; 438/285; 438/301; 438/289

(58) Field of Classification Search .................. 257/368, 257/369, 382, 384, 408, 615, E29.255, E29.266, 257/E21.409, E21.619, E21.562, E21.634; 438/285, 289, 301
See application file for complete search history.

(56) References Cited

U.S. PATENT DOCUMENTS

| | | | |
|---|---|---|---|
| 6,287,964 | B1 | 9/2001 | Cho |
| 7,023,055 | B2 | 4/2006 | Ieong et al. |
| 7,256,121 | B2 | 8/2007 | Yue et al. |
| 7,329,923 | B2 | 2/2008 | Doris et al. |

(Continued)

OTHER PUBLICATIONS

Ang, K. W., et al., "Enhanced performance in 50 nm N-MOSFETs with silicon-carbon source/drain regions", IEEE International Electron Devices Meeting 2004, pp. 1069-1071, Piscataway NJ.

(Continued)

*Primary Examiner* — Victor A Mandala
(74) *Attorney, Agent, or Firm* — Scully, Scott, Murphy & Presser, P.C.; H. Daniel Schnurmann (57) ABSTRACT

Semiconductor structures are disclosed that have embedded stressor elements therein. The disclosed structures include at least one FET gate stack located on an upper surface of a semiconductor substrate. The at least one FET gate stack includes source and drain extension regions located within the semiconductor substrate at a footprint of the at least one FET gate stack. A device channel is also present between the source and drain extension regions and beneath the at least one gate stack. The structure further includes embedded stressor elements located on opposite sides of the at least one FET gate stack and within the semiconductor substrate. Each of the embedded stressor elements includes, from bottom to top, a first layer of a first epitaxy doped semiconductor material having a lattice constant that is different from a lattice constant of the semiconductor substrate and imparts a strain in the device channel, a second layer of a second epitaxy doped semiconductor material located atop the first layer, and a delta monolayer of dopant located on an upper surface of the second layer. The structure further includes a metal semiconductor alloy contact located directly on an upper surface of the delta monolayer.

20 Claims, 2 Drawing Sheets

U.S. PATENT DOCUMENTS

| | | | |
|---|---|---|---|
| 7,413,961 | B2 | 8/2008 | Chong et al. |
| 7,446,026 | B2 | 11/2008 | Zhang et al. |
| 7,494,884 | B2 | 2/2009 | Lin et al. |
| 8,022,488 | B2 * | 9/2011 | Cheng et al. ............ 257/408 |
| 8,035,141 | B2 * | 10/2011 | Chan et al. ............ 257/288 |
| 2002/0042197 | A1 | 4/2002 | Cabral, Jr. et al. |
| 2005/0082522 | A1 * | 4/2005 | Huang et al. ............ 257/19 |
| 2005/0116290 | A1 | 6/2005 | de Souza et al. |
| 2006/0205189 | A1 | 9/2006 | Messenger et al. |
| 2006/0234455 | A1 | 10/2006 | Chen et al. |
| 2007/0026599 | A1 | 2/2007 | Peidous et al. |
| 2007/0057287 | A1 | 3/2007 | Lin et al. |
| 2007/0126036 | A1 | 6/2007 | Ohta et al. |
| 2007/0132038 | A1 | 6/2007 | Chong et al. |
| 2007/0138570 | A1 | 6/2007 | Chong et al. |
| 2007/0173022 | A1 | 7/2007 | Wang et al. |
| 2007/0184601 | A1 | 8/2007 | Zhang et al. |
| 2007/0252204 | A1 | 11/2007 | Wei et al. |
| 2007/0298575 | A1 | 12/2007 | Nouri et al. |
| 2008/0001182 | A1 | 1/2008 | Chen et al. |
| 2008/0006818 | A1 | 1/2008 | Luo et al. |
| 2008/0083948 | A1 | 4/2008 | Lin et al. |
| 2008/0157200 | A1 | 7/2008 | Kim et al. |
| 2008/0251851 | A1 | 10/2008 | Pan et al. |
| 2008/0299724 | A1 | 12/2008 | Grudowski et al. |
| 2009/0140186 | A1 * | 6/2009 | Kunz et al. ............ 251/129.2 |
| 2009/0221119 | A1 | 9/2009 | Grudowski et al. |
| 2009/0242989 | A1 | 10/2009 | Chan et al. |
| 2010/0224938 | A1 * | 9/2010 | Zhu ............ 257/369 |
| 2010/0240186 | A1 * | 9/2010 | Wang ............ 438/285 |
| 2010/0301394 | A1 * | 12/2010 | Shimamune et al. ............ 257/192 |
| 2011/0079861 | A1 * | 4/2011 | Shifren et al. ............ 257/402 |
| 2011/0101305 | A1 * | 5/2011 | Yu et al. ............ 257/18 |
| 2011/0256681 | A1 * | 10/2011 | Lin et al. ............ 438/285 |
| 2011/0260213 | A1 * | 10/2011 | Chan et al. ............ 257/190 |
| 2011/0287600 | A1 * | 11/2011 | Cheng et al. ............ 438/299 |

OTHER PUBLICATIONS

Chung, S. S., et al., "Design of high-performance and highly reliable nMOSFETs with embedded Si:C S/D extension stressor(Si:C S/D-E)", Symposium on VLSI Technology Digest of Technical Papers, 2009, pp. 158-159.

Liu, Y., et al., "Strained Si Channel MOSFETs with Embedded Silicon Carbon Formed by Solid Phase Epitaxy" VLSI Technology, 2007 IEEE Symposium, Jun. 12-14, 2007, pp. 44-45.

Ren, Z., et al., "On implementation of embedded phosphorus-doped SiC stressors in SOI nMOSFETs", VLSI Technology, 2008 Symposium, Jun. 17-19, 2008, pp. 172-173.

Wong, H.-S., et al., "Silicon-Carbon Stressors With High Substitutional Carbon Concentration and In Situ Doping Formed in Source/Drain Extensions of n-Channel Transistors", IEEE Electron Device Letters, 2008, pp. 460-463, vol. 29, No. 5.

Yang, B., et al., "High-performance nMOSFET with in-situ phosphorus-doped embedded Si:C (ISPD eSi:C) source-drain stressor", Electron Devices Meeting, 2008, IEDM 2008, IEEE International, Dec. 15-17, 2008, pp. 1-4.

International Search Report/Written Opiinion, Jan. 18, 2012.

* cited by examiner

DELTA MONOLAYER DOPANTS EPITAXY FOR EMBEDDED SOURCE/DRAIN SILICIDE

RELATED APPLICATIONS

This application is related to co-pending and co-assigned U.S. application Ser. No. 12/764,329, filed Apr. 21, 2010, the entire content of which is incorporated herein by reference.

BACKGROUND

The present invention relates to a semiconductor structure and a method of fabricating the same. More particularly, the present invention relates to a semiconductor structure including an embedded stressor element that includes a delta monolayer of a dopant located an upper surface thereof. The present invention also provides a method of fabricating such a semiconductor structure.

Mechanical stresses within a semiconductor device substrate have been widely used to modulate device performance such as, for example, drive current. For example, in common silicon technology, the channel of a transistor is oriented along the {110} planes of silicon. In this arrangement, hole mobility is enhanced when the channel is under compressive stress in the film direction and/or under tensile stress in a direction normal of the channel, while the electron mobility is enhanced when the silicon film is under tensile stress in the film direction and/or under compressive stress in the direction normal of the channel. Therefore, compressive and/or tensile stresses can be advantageously created in the channel region of a p-channel field effect transistor (pFET) and/or an n-channel field effect transistor (nFET) in order to enhance the performance of such devices.

One possible approach for creating a desirable stressed silicon channel region is to form embedded SiGe or Si:C stressors (i.e., stress wells) within the source and drain regions of a complementary metal oxide semiconductor (CMOS) device to induce compressive or tensile strain in the channel region located between the source region and the drain region. For example, it has been demonstrated that hole mobility can be enhanced significantly in p-channel silicon transistors by using an embedded SiGe stressor in the source and drain regions. For re-channel silicon transistors, it has also been demonstrated that the electron mobility can be enhanced by using selective Si:C in which C is substitutional.

Although prior art structures including embedded stressor elements are known in the art, there is still a need for forming semiconductor structures, including CMOS structures, which limit the series contact resistance to the channel resistance. This requirement needs not only extremely low junction sheet resistance, but also ultra low-contact resistivites that can be obtained with existing self-aligned silicidation technology.

SUMMARY

The present disclosure provides a semiconductor structure including an embedded stressor element for nFETs and/or pFETs in which the embedded stressor element has a delta monolayer of dopant (which can also be referred to herein as Atomic Layer Dopant (ALDo)), present between an underlying epitaxy doped semiconductor material and an overlying metal semiconductor alloy contact. The term "delta monolayer of dopant" is used throughout the present application to denote a thin layer (on the order of less than 5 nm) that contains only dopant atoms therein. The presence of the delta monolayer of dopant between the underlying epitaxy doped semiconductor material of the embedded stressor element and the overlying metal semiconductor alloy reduces the overall contact resistance of the structure.

In one embodiment, a semiconductor structure is provided that includes at least one FET gate stack located on an upper surface of a semiconductor substrate. The at least one FET gate stack of the semiconductor structure includes a source extension region and a drain extension region located within the semiconductor substrate at a footprint of the at least one FET gate stack. A device channel is also present between the source extension region and the drain extension region and beneath the at least one gate stack. The structure further includes embedded stressor elements located on opposite sides of the at least one FET gate stack and within the semiconductor substrate. Each of the embedded stressor elements includes a first layer of a first epitaxy doped semiconductor material having a lattice constant that is different from a lattice constant of the semiconductor substrate and imparts a strain in the device channel, a second layer of a second epitaxy doped semiconductor material located atop the first layer, and a delta monolayer of dopant located on an upper surface of the second layer of the second epitaxy doped semiconductor material. The first layer of the first epitaxy doped semiconductor material has a lower content of dopant as compared to the second layer of the second epitaxy doped semiconductor material. The structure further includes a metal semiconductor alloy contact located directly on an upper surface of the delta monolayer of dopant.

In another embodiment, a CMOS structure is provided that includes at least one pFET gate stack and at least one nFET gate stack located on an upper surface of a semiconductor substrate. Each of the at least one pFET gate stack and the at least one nFET gate stack includes a source extension region and a drain extension region located within the semiconductor substrate at a footprint of both the at least one pFET gate stack and the at least one nFET gate stack. The structure further includes a device channel located between the source extension region and the drain extension region and beneath each of the gate stacks. pFET embedded stressor elements are located on opposite sides of the at least one pFET gate stack and within the semiconductor substrate, and nFET embedded stressor elements are located on opposite sides of the at least one nFET gate stack and within the semiconductor substrate. Each of the embedded stressor elements includes a first layer of a first epitaxy doped semiconductor material having a lattice constant that is different from a lattice constant of the semiconductor substrate and imparts a strain in the device channel, a second layer of a second epitaxy doped semiconductor material located atop the first layer, and a delta monolayer of dopant located on the second layer. In the disclosed structure, the first layer of the first epitaxy doped semiconductor material has a lower content of dopant as compared to the second layer of the second epitaxy doped semiconductor material. The structure further includes a metal semiconductor alloy contact located directly on an upper surface of the delta monolayer of dopant.

The present disclosure also provides a method of fabricating the above mentioned structures. The method includes forming at least one FET gate stack on an upper surface of a semiconductor substrate. A source extension region and a drain extension region are then formed within the semiconductor substrate at the footprint of the at least one FET gate stack. Recessed regions are formed on opposite sides of the at least one FET gate stack and within the semiconductor substrate. A pre-embedded stressor element is formed substantially within each recessed region. Each pre-embedded stressor element formed at this stage includes, from bottom to top, a first layer of a first epitaxy doped semiconductor material having a lattice constant that is different from a lattice constant of the semiconductor substrate and imparts a strain in the device channel, a second layer of a second epitaxy doped semiconductor material located atop the first layer, wherein the first layer of the first epitaxy doped semiconductor material has a lower content of dopant as compared to the second layer of the second epitaxy doped semiconductor material, a delta monolayer of dopant located on an upper surface of the second layer, and a third layer of epitaxy doped semiconductor layer located atop the delta monolayer. The method also includes converting a portion of the third layer of the pre-embedded stressor element into a metal semiconductor alloy contact. The metal semiconductor alloy contact is located directly an upper surface of the delta monolayer. It is observed that after this conversion, an embedded stressor element including the first layer of the first epitaxy doped semiconductor material, the second layer of the second epitaxy doped semiconductor material, and the delta monolayer of dopant is provided that imparts strain upon the device channel, while reducing the overall contact resistance of the structure.

DETAILED DESCRIPTION

In the following description, numerous specific details are set forth, such as particular structures, components, materials, dimensions, processing steps and techniques, in order to provide an understanding of some aspects of the present invention. However, it will be appreciated by one of ordinary skill in the art that the invention may be practiced without these specific details. In other instances, well-known structures or processing steps have not been described in detail in order to avoid obscuring the invention.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Embodiments of the present disclosure will now be described in greater detail by referring to the following discussion and drawings that accompany the present application. The drawings of the present application, which are referred to herein below in greater detail, are provided for illustrative purposes and, as such, they are not drawn to scale.

Figure 1:
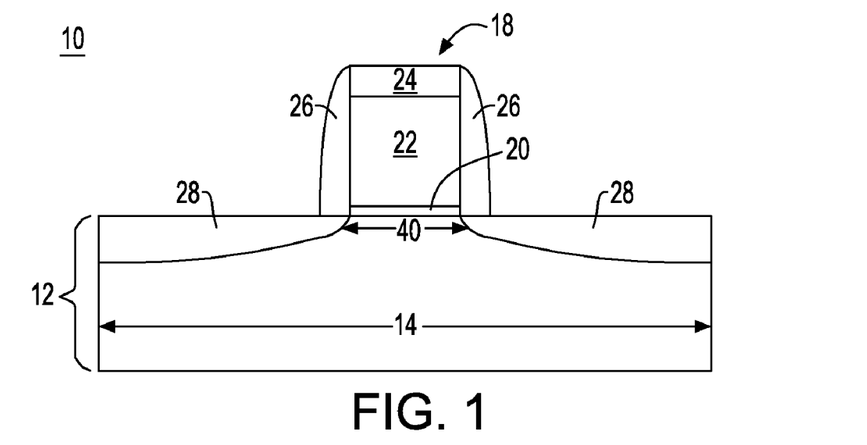
FIG. 1 is a pictorial representation (through a cross sectional view) depicting an initial structure including at least one FET gate stack located on an upper surface of a semiconductor substrate that can be employed in one embodiment of the invention.

Reference is first made to FIG. 1 which illustrates an initial structure 10 that can be employed in one embodiment of the present invention. The initial structure 10 includes a semiconductor substrate 12 including at least one FET device region 14. A second device region (not shown) can be formed to the periphery of the at least one FET device region 14 that is shown in FIG. 1. The semiconductor substrate 12 can also include at least one isolation region (not specifically shown). When present, the at least one isolation region would be located to the periphery of the at least one FET device region 14.

The initial structure 10 further includes at least one FET gate stack 18 located on an upper surface of the at least one FET device region 14 of the semiconductor substrate 12. In the drawings, a single FET gate stack is shown for illustrative purposes only.

The at least one FET gate stack 18 employed can include at least one pFET gate stack, at least one nFET gate stack or a combination of at least one pFET gate stack and at least one nFET gate stack that are located on different device regions of the semiconductor substrate 12. When a combination of nFET gate stacks and pFET gate stacks are employed, an isolation region is typically present between the device regions that include the different polarity devices.

The at least one FET gate stack 18, which is typically patterned, includes, from bottom to top, a gate dielectric 20, a gate electrode 22 and an optional gate electrode cap 24; gate electrode cap 24 can also be referred to herein as a dielectric cap. At least one spacer 26 (which can be referred to as an inner spacer) is typically located on the sidewalls of each of the FET gate stacks that are present in the initial structure 10. In some embodiments, no spacer 26 is present.

The initial structure 10 shown in FIG. 1 can be formed by conventional methods and include materials well known to those skilled in the art. For example, the semiconductor substrate 12 of the initial structure 10 can be comprised of any semiconductor material including, but not limited to, Si, Ge, SiGe, SiC, SiGeC, GaAs, GaN, InAs, InP and all other III/V or II/VI compound semiconductors. The semiconductor material of the semiconductor substrate 12 has a lattice constant that is dependent on the type of semiconductor material employed. Semiconductor substrate 12 may also comprise an organic semiconductor or a layered semiconductor such as Si/SiGe, a silicon-on-insulator (SOI), a SiGe-on-insulator (SGOI) or a germanium-on-insulator (GOI). In one embodiment of the invention, the semiconductor substrate 12 includes an SOI substrate in which top and bottom semiconductor material layers such as Si are spaced apart by a buried dielectric such as a buried oxide. In some embodiments, the semiconductor substrate 12 is composed of bulk silicon or a silicon-on-insulator. The semiconductor substrate 12 may be doped, undoped or contain doped and undoped regions therein. The semiconductor substrate 12 may include a single crystal orientation or it may include at least two coplanar surface regions that have different crystal orientations (the latter substrate is referred to in the art as a hybrid substrate). When a hybrid substrate is employed, an nFET is typically formed on a {100} crystal surface, while a pFET is typically formed on a {110} crystal plane. The hybrid substrate can be formed by techniques that are well known in the art. See, for example, co-owned U.S. Pat. No. 7,329,923, U.S. Publication No. 2005/0116290, dated Jun. 2, 2005 and U.S. Pat. No. 7,023,055, the entire contents of each are incorporated herein by reference.

The at least one isolation region (not specifically shown) is typically formed into the semiconductor substrate 12 so as to form device regions within the semiconductor substrate 12. The at least one isolation region may be a trench isolation region or a field oxide isolation region. The trench isolation region is formed utilizing a conventional trench isolation process well known to those skilled in the art. For example, lithography, etching and filling of the trench with a trench dielectric may be used in forming the trench isolation region. Optionally, a liner may be formed in the trench prior to trench fill, a densification step may be performed after the trench fill and a planarization process may follow the trench fill as well. The height of the trench isolation region can be adjusted by performing a wet etching process such as etching with a solution containing hydrofluoric acid. The field oxide can be formed utilizing a so-called local oxidation of silicon process.

The various device regions may be doped (e.g., by ion implantation processes) to form well regions within the different device regions. For clarity, the well regions are not specifically shown in the drawings of the present application. The well regions for pFET devices typically include an n-type dopant, and the well regions for nFET devices typically include a p-type dopant. The dopant concentration of the well regions of the same conductivity type device may be the same or different. Likewise, the dopant concentration of the well regions of the different conductivity type may be the same or different.

Figure 2:
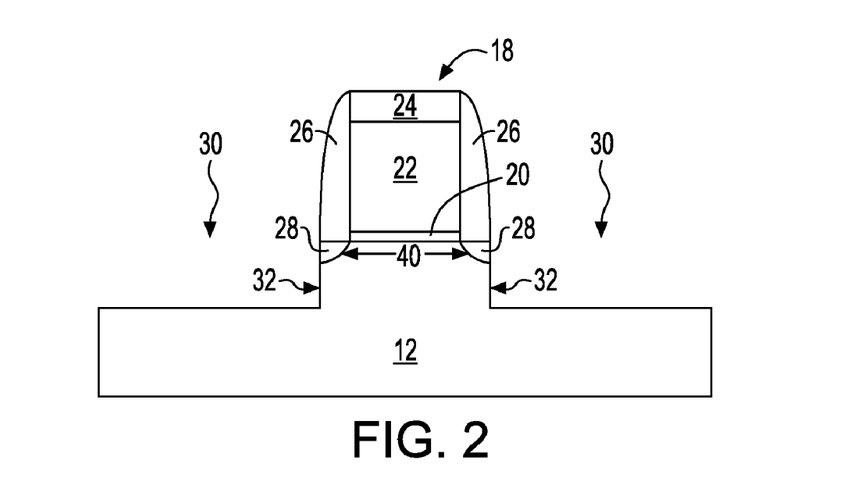
FIG. 2 is a pictorial representation (through a cross sectional view) depicting the structure of FIG. 1 after forming recessed regions within the semiconductor substrate which are located at the footprint of the at least one FET gate stack.
Figure 3:
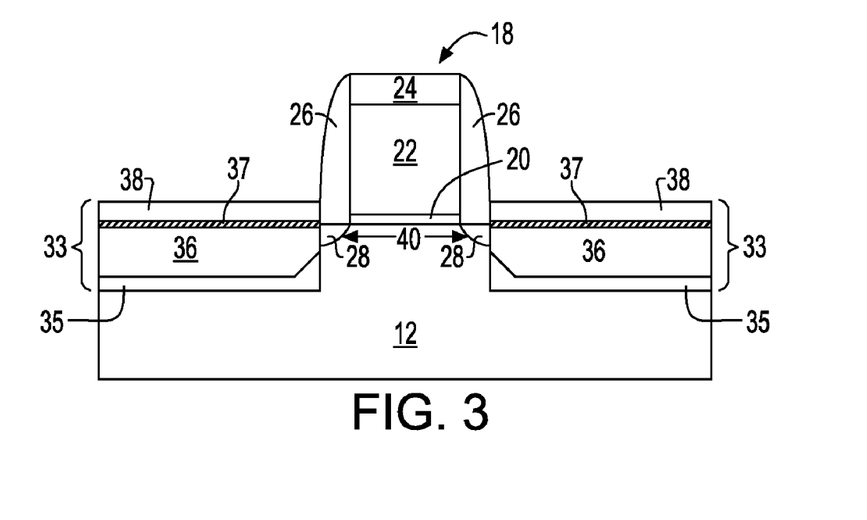
FIG. 3 is a pictorial representation (through a cross sectional view) depicting the structure of FIG. 2 after filling each of the recessed regions with a pre-embedded stressor element that includes, from bottom to top, a first layer of a first epitaxy doped semiconductor material, a second layer of a second epitaxy doped semiconductor material, a delta monolayer of a dopant, and a third layer of a third epitaxy doped semiconductor material.
Figure 4:
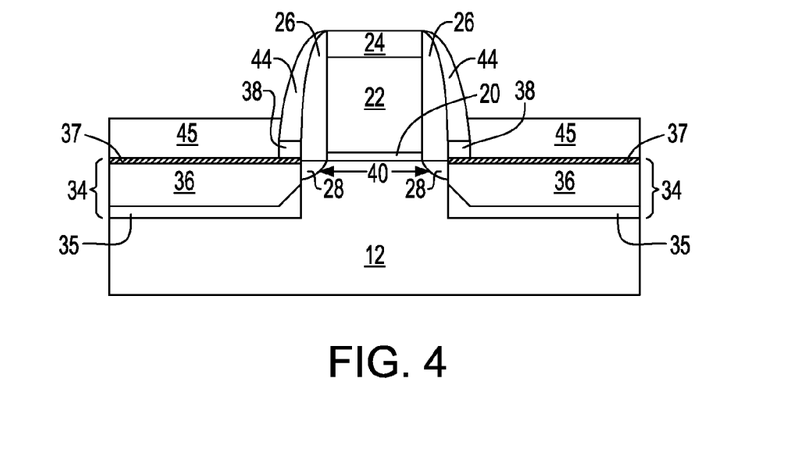
FIG. 4 is a pictorial representation (through a cross sectional view) depicting the structure of FIG. 3 after forming another spacer and converting the third layer of the third epitaxy doped semiconductor material into a metal semiconductor alloy layer which is located atop the delta monolayer of dopant.

After processing the semiconductor substrate 12, the at least one FET gate stack 18 is formed utilizing any conventional process that is well known to those skilled in the art. In embodiments in which nFET and pFET gate stacks are both present, a first polarity FET gate stack (either nFET or pFET) can be formed before, during or after forming a second polarity FET gate stack (either pFET or nFET not used as the first polarity FET gate stack). It is observed that although FIG. 1 as well as FIGS. 2-4 show the presence of a single FET device region 14 and a single FET gate stack, the present invention can also be practiced when more than one device region is present and/or with a different number of FET gate stacks 18. When more than one gate stack is present, the different gate stacks can have the same or different gate dielectrics and/or gate electrode materials. Different gate dielectric and gate electrode materials can be obtained utilizing block masks to block formation of one type of material from one region, while forming the material in another region not including the block mask. When more than one gate stack is provided, the gate stacks can be used in forming a FET of the same or different conductivity type.

In one embodiment, the at least one FET gate stack 18 is formed by deposition of various material layers, followed by patterning the deposited material layers via lithography and etching. In another embodiment, the at least one FET gate stack 18 is formed by a replacement gate process that includes the use of a dummy gate material.

Notwithstanding the technique used in forming the at least one FET gate stack 18, the at least one FET gate stack 18 includes, from bottom to top, a gate dielectric 20, a gate electrode 22, and an optional gate electrode cap 24.

The gate dielectric 20 includes any gate insulating material such as for example, an oxide, a nitride, an oxynitride or a multilayered stack thereof. In one embodiment, the gate dielectric 20 is a semiconductor oxide, a semiconductor nitride or a semiconductor oxynitride. In another embodiment, the gate dielectric 20 includes a dielectric metal oxide having a dielectric constant that is greater than the dielectric constant of silicon oxide, e.g., 3.9. Typically, the gate dielectric 20 that is employed has a dielectric constant greater than 4.0, with a dielectric constant of greater than 8.0 being more typical. Such dielectric materials are referred to herein as a high k dielectric. Exemplary high k dielectrics include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, a silicate thereof, and an alloy thereof. Multilayered stacks of these high k materials can also be employed as the gate dielectric 20. Each value of x is independently from 0.5 to 3 and each value of y is independently from 0 to 2.

The thickness of the gate dielectric 20 may vary depending on the technique used to form the same. Typically, the gate dielectric 20 has a thickness from 1 nm to 10 nm, with a thickness from 2 nm to 5 nm being more typical. When a high k gate dielectric is employed as the gate dielectric 20, the high k gate dielectric can have an effective oxide thickness on the order of, or less than, 1 nm.

The gate dielectric 20 can be formed by methods well known in the art. In one embodiment, the gate dielectric 20 can be formed by a deposition process such as, for example, chemical vapor deposition (CVD), physical vapor deposition (PVD), molecular beam deposition (MBD), pulsed laser deposition (PLD), liquid source misted chemical deposition (LSMCD), and atomic layer deposition (ALD). Alternatively, the gate dielectric 20 can be formed by a thermal process such as, for example, thermal oxidation and/or thermal nitridation.

The gate electrode 22 comprises any conductive material including, but not limited to, polycrystalline silicon, polycrystalline silicon germanium, an elemental metal, (e.g., tungsten, titanium, tantalum, aluminum, nickel, ruthenium, palladium and platinum), an alloy of at least one elemental metal, an elemental metal nitride (e.g., tungsten nitride, aluminum nitride, and titanium nitride), an elemental metal silicide (e.g., tungsten silicide, nickel silicide, and titanium silicide) and multilayered combinations thereof. In one embodiment, the gate electrode 22 is comprised of an nFET metal gate. In another embodiment, the gate electrode 22 is comprised of a pFET metal gate. In a further embodiment, the gate electrode 22 is comprised of polycrystalline silicon. The polysilicon gate can be used alone, or in conjunction with another conductive material such as, for example, a metal gate electrode material and/or a metal silicide gate electrode material.

The gate electrode 22 can be formed utilizing a conventional deposition process including, for example, chemical vapor deposition (CVD), plasma enhanced chemical vapor deposition (PECVD), evaporation, physical vapor deposition (PVD), sputtering, chemical solution deposition, atomic layer deposition (ALD) and other like deposition processes. When Si-containing materials are used as the gate electrode 22, the Si-containing materials can be doped within an appropriate impurity by utilizing either an in-situ doping deposition process or by utilizing deposition, followed by a step such as ion implantation or gas phase doping in which the appropriate impurity is introduced into the Si-containing material. When a metal silicide is formed, a conventional silicidation process is employed.

The as-deposited gate electrode 22 typically has a thickness from 10 nm to 100 nm, with a thickness from 20 nm to 50 nm being even more typical.

In some embodiments, optional gate electrode cap 24 can be formed atop the gate electrode 22. The optional gate electrode cap 24 includes a dielectric oxide, nitride, oxynitride or any combination thereof including multilayered stacks. In one embodiment, the optional dielectric electrode cap 24 is comprised of silicon nitride. When the optional gate electrode cap 24 is present, the optional gate electrode cap 24 is formed utilizing a conventional deposition process well known to those skilled in the art including, for example, CVD and PECVD. Alternatively, the optional gate electrode cap 24 can be formed by a thermal process such as, for example, oxidation and/or nitridation. The thickness of the optional gate electrode cap 24 may vary depending on the exact cap material employed as well as the process that is used in forming the same. Typically, the optional gate electrode cap 24 has a thickness from 5 nm to 200 nm, with a thickness from 10 nm to 50 nm being more typical. The optional gate electrode cap 24 is typically employed when the gate electrode 22 is composed of a Si-containing material such as polysilicon.

The initial structure 10 shown in FIG. 1 can also include at least one spacer 26 whose base is located on an upper surface of the semiconductor substrate 12. An edge of the at least one spacer 26 is located on a sidewall of the at least one FET gate stack 18. The at least one spacer 26 includes any dielectric material such as, for example, an oxide, a nitride, an oxynitride or any combination thereof. Typically, but not necessarily always, the at least one spacer 26 is comprised of a different material than the optional gate electrode cap 24. In one embodiment, the at least one spacer 26 is comprised of silicon oxide or silicon nitride. In another embodiment, the at least one spacer 26 includes a thin inner spacer, and a wider (relative to the inner spacer) outer spacer. In such an embodiment, the thin inner spacer can be comprised of silicon oxide, while the wider outer spacer can be comprised of silicon nitride.

The at least one spacer 26 can be formed utilizing processes that are well known to those skilled in the art. For example, the at least one spacer 26 can be formed by deposition of the spacer material, followed by etching. The width of the at least one spacer 26, as measured at its base, is typically from 2 nm to 50 nm, with a width, as measured at its base, from 5 nm to 15 nm being more typical.

The initial structure 10 shown in FIG. 1 further includes extension regions 28 that are located within the semiconductor substrate 12 at the footprint of each of the FET gate stacks. In FIG. 1, one of the regions labeled as 28 is a source extension region, while the other region labeled as 28 is a drain extension region. The extension regions 28 can be formed into the semiconductor substrate 12 utilizing an extension ion implantation process that is well known to those skilled in the art. The at least one FET gate stack 18 and, if present, the at least one spacer 26, serve as an implantation mask during the extension ion implant process in the FET device region 14.

After implanting the extension regions 28, an anneal can be used to activate the extension regions 28. The anneal, which can be performed any time after the ion implantation step, is typically performed at a temperature greater than 800° C., with a temperature of greater than 850° C. being more typical. The anneal can be performed utilizing any conventional anneal process. Examples of anneals that can be employed include, for example, a rapid thermal anneal, a furnace anneal, a laser anneal, a microwave anneal, or a combination of those techniques. The duration of the anneal, i.e., the annealing time, may vary depending on the exact anneal process utilized as well as the temperature of the anneal. Typically, the anneal is performed for a time period of 10 minutes or less. The anneal is typically performed in an inert ambient such as, for example, helium, nitrogen, and/or argon. In some embodiments, the annealing can be performed utilizing a forming gas (a mix of hydrogen and nitrogen).

It is observed that the portion of the semiconductor substrate 12 that is located beneath the at least one FET gate stack 18 which is bounded by the extension regions 28 is the device channel 40.

In some embodiments, an optional halo implant is performed that forms optional halo regions (not shown) within the semiconductor substrate 12 of the initial structure 10. The optional halo implant can be performed utilizing any conventional halo implant, such as an angled halo ion implant, that is well known to those skilled in the art. After the optional halo implant, an optional halo activation anneal is typically performed at a temperature of 1350° C. or less. In one embodiment, the optional halo activation anneal can include a laser anneal or rapid thermal anneal.

Referring to FIG. 2, there is shown the structure of FIG. 1 after forming recessed regions 30 within the semiconductor substrate 12 at the footprint of the at least one FET gate stack 18. The recessed regions 30 are formed on opposite sides of the FET gate stack as shown in FIG. 2; one of the recessed regions 30 can be referred to as a source trench, while the other recessed region can be referred to as a drain trench. The recessed regions 30, e.g., trenches, are formed utilizing an etching technique that is well known to those skilled in the art. The at least one FET gate stack 18, and if present, the at least one spacer 26 serve as an etch mask during the etching process. The etching process selectively removes exposed portions of the semiconductor substrate 12 that are not protected by the at least one FET gate stack 18 and, if present, the at least one spacer 26. The depth of each of the recessed regions 30, as measured from the top surface of the substrate 12 to the bottom of the recessed region 30, is typically from 20 nm to 150 nm, with from 30 nm to 70 nm being more typical.

The etching that can be used in forming each of the recessed regions 30 includes wet etching, dry etching or a combination of wet and dry etching. In one embodiment, an anisotropic etch is employed in forming each of the recessed regions 30. In another embodiment, an isotropic etch is employed in forming each of the recessed regions 30. In a further embodiment, a combination of anisotropic etching and isotropic etching can be employed in forming each of the recessed regions 30. When a dry etch is employed in forming each of the recessed regions 30, the dry etch can include one of reactive ion etching (RIE), plasma etching, ion beam etching and laser ablation. When a wet etch is employed in forming each of the recessed regions 30, the wet etch includes any chemical etchant, such as, for example, ammonium hydroxide that selectively etches the exposed FET device region 14 of the semiconductor substrate 12. In some embodiments, a crystallographic etching process can be used in forming each of the recessed regions 30.

In the embodiment illustrated in FIG. 2, the etching provides recessed regions 30 within the semiconductor substrate 12 that have substantially straight sidewalls 32. The substantially straight sidewalls 32 may have some taper.

In an alternative embodiment (not shown), a structure can be formed having faceted recessed regions. The alternative structure can be formed utilizing a dry etching process, followed by a lateral wet etching process. The lateral wet etch process can include, for example, ammonium hydroxide.

Referring to FIG. 3, there is shown the structure of FIG. 2 after forming a pre-embedded stressor element 33 within each of the recessed regions 30. Each pre-embedded stressor element 33 includes a material stack comprising, from bottom to top, a first layer 35 of a first epitaxy doped semiconductor material, a second layer 36 of a second epitaxy doped semiconductor material, a delta monolayer of a dopant 37, and a third layer 38 of a third epitaxy doped semiconductor material. The delta monolayer of a dopant 37 includes a layer of an n-type dopant or a p-type dopant that is located between the second layer 36 and the third layer 38. In some embodiments, a delta monolayer of a dopant can be located within the first layer 35, the second layer 36 and/or the third layer 38. These particular embodiments are not shown in the drawings of the present application.

The term "pre-embedded stressor element" is used at this stage of the process since the third layer of the pre-embedded stressor element is converted into a metal semiconductor alloy during a subsequent anneal step. Thus, after this subsequent anneal an embedded stressor element is provided that includes, from bottom to top, the first layer 35, the second layer 36 and the delta monolayer of dopant 37.

As stated above, the first layer 35 of each pre-embedded stressor element 33 is comprised of a first epitaxy doped semiconductor material. The first epitaxy doped semiconductor material has a different lattice constant than the lattice constant of the semiconductor substrate 12 and therefore it is capable of enhancing the electron mobility in the device channel 40. In one embodiment, and when the semiconductor substrate 12 is composed of silicon and when a pFET gate stack is present, the first layer 35 of the first epitaxy doped semiconductor material is composed of SiGe or SiGe:C. In another embodiment, and when the semiconductor substrate 12 is composed of silicon and when an nFET gate stack is present, the first layer 36 of the first epitaxy doped semiconductor material is composed of Si:C, i.e., silicon doped with carbon.

The dopant within the first layer 36 can be a p-type dopant for a pFET gate stack or an n-type dopant for an nFET gate stack. The term 'p-type dopant' denotes an atom from Group IIIA of the Periodic Table of Elements including for example, B, Al, Ga and/or In. Of these Group IIIB Elements, and in one embodiment of the invention, B is employed. The term 'n-type dopant' denotes an atom from Group VA of the Periodic Table of Elements including for example, P, As and/or Sb. Of these Group VA Elements, and in one embodiment of the invention, P is employed. It is noted that the nomenclature 111B and VA is from a CAS version of the Periodic Table of Elements.

Notwithstanding the type of dopant within the first layer 35, the dopant present in first layer 35 of first epitaxy doped semiconductor material is in a range from 5E19 atoms/cm$^3$ to 1E21 atoms/cm$^3$ with a dopant concentration from 1E20 atoms/cm$^3$ to 7E20 atoms/cm$^3$ being more typical.

The first layer 35 of the first epitaxy doped semiconductor material fills a lower portion of each of the recessed regions 30 and can extend up to, but typically not beyond, a lower surface of the extensions regions 28.

The first layer 35 of each pre-embedded stressor element 33 is formed into the recessed regions 30 utilizing any in-situ doped epitaxial growth process that is well known to those skilled in the art. The epitaxial growth ensures that the first layer 35 of the first epitaxy doped semiconductor material is crystalline and has a same crystallographic structure as that of the surface of the semiconductor substrate 12 in which the first layer 35 is formed. The in-situ doped epitaxial growth process typically employs a precursor gas mixture in which the dopant atoms are present. The types of precursors used in forming the first layer 35 of the first epitaxy doped semiconductor material are well known to those skilled in the art.

The second layer 36 of each pre-embedded stressor element 33 is formed on the upper surface of the first layer 35 as well as on any exposed sidewalls of the semiconductor substrate 12 not including the first layer 35. The second layer 36 of each pre-embedded stressor element 33 includes a second epitaxy doped semiconductor material that may include the same or different, preferably the same, epitaxy semiconductor material as the first layer 35. The second layer 36 of each pre-embedded stressor element 33 typically has the same lattice constant as first layer 35. The dopant within the second epitaxy doped semiconductor material is the same conductivity type dopant as that of the first epitaxy doped semiconductor material. The content of dopant within the second epitaxy doped semiconductor material is however greater than the content of dopant within the first epitaxy semiconductor material. Because the first layer 35 of the first epitaxy doped semiconductor material has a lower content of dopant as compared to the second layer 36 of the second epitaxy doped semiconductor material, the first layer 35 is capable of retarding out diffusion of dopants from the second layer 36. The second layer 36 of each pre-embedded stressor element 33 can have a dopant concentration from 5E21 atoms/cm$^3$ to 3E22 atoms/cm$^3$, with a dopant concentration from 8E19 atoms/cm$^3$ to 4E20 atoms/cm$^3$ being more typical.

The second layer 36 which essentially fills the remaining portion of each recess regions 30 can be formed by a conventional epitaxial growth process including the in-situ doped conformal epitaxy process mentioned above with respect to the first epitaxy semiconductor material of the first layer 35. Any known precursor can be used in forming the second layer 36. In some embodiments, the first and second layers 35, 36 of each pre-embedded stressor element 33 can be formed without breaking vacuum between the formation of these layers. In other embodiments, the first and second layers 35, 36 of each pre-embedded stressor element 33 are formed by breaking vacuum between each epitaxial growth step.

As mentioned above, each pre-embedded stressor element 33 also includes a delta monolayer of a dopant (n-type or p-type) 37 located on the second layer 36. The delta monolayer of a dopant 37 is essentially coplanar with the remaining surface of the semiconductor substrate 12 that is located beneath the at least one gate stack 18. The dopant within the delta monolayer 37 matches the dopant within the first and second epitaxy doped semiconductor materials. Thus, for example, when the first and second epitaxy doped semiconductor materials include a p-type, then the delta monolayer 37 also includes a p-type. Likewise, when the first and second epitaxy doped semiconductor materials include an n-type, then the delta monolayer 37 also includes an n-type.

The delta monolayer 37, which includes only dopant atoms, is formed by interrupting the growth of at least the second epitaxy doped semiconductor material and thereafter depositing the delta monolayer 37 utilizing rapid thermal chemical vapor deposition (RTCVD). The delta monolayer 37 is a thin layer whose thickness is approximately from 0.5 nm to 3 nm; other thicknesses can also be employed.

Once the delta monolayer 37 is formed, the third layer 38 of the third epitaxy doped semiconductor can be formed. The third layer 38 of the third epitaxy doped semiconductor material typically has the same composition (i.e., semiconductor material and dopant) as that of the first epitaxy doped semiconductor material. Although the third layer 38 typically has the same composition as that of the first epitaxy doped semiconductor material, the third layer 37 can have the same or different, typically the same, dopant concentration as that of the first epitaxy doped semiconductor material. The third layer 37 of each pre-embedded stressor element 33 can be formed using one of the procedures described above for forming the first layer 35 of the first epitaxy doped semiconductor material. The third layer 37 of the third expitaxy doped semiconductor material extends above the upper surface of the original semiconductor substrate 12.

It is observed that when CMOS devices are to be fabricated, one type of pre-embedded stressor element can be formed into the pFET device region, while another type of pre-embedded stressor element can be formed into the nFET device region. This can be achieved by following the procedure mentioned above for forming one type of pre-embedded stressor element in one of the device regions (pFET or nFET device region), while utilizing a block mask over the other device region. The block mask can be removed and a second block mask can be formed atop the device region that includes the one type of embedded stressor element. The above procedure can then be repeated to form another type of embedded stressor element within the device region not protected by the second block mask.

It is thus emphasized that the present disclosure provides a pre-embedded stressor element for an nFET and/or a pre-embedded stressor element for a pFET.

Referring now to FIG. 4 there is shown the structure of FIG. 3 after further CMOS processing including formation of another spacer 44 (which can be referred to herein as an outer spacer relative to spacer 26) and formation of a source region and drain region (not specifically shown in the drawings of the present application). The source region and the drain region are collectively referred to herein as source/drain regions. The source/drain regions are typically formed within the second layer 36 of the second epitaxy doped semiconductor material described above. In some embodiments and prior to the formation of the another spacer 44, the optional gate electrode cap 24 can be removed from the structure. The removal of the optional gate electrode cap 24 can be performed utilizing an etchant that selectively removes the gate electrode cap material relative to the at least one spacer 26, the underlying gate electrode 22 and the third layer 38 of each embedded stressor element 34. An example of such an etchant includes, but is not limited to reactive ion etching.

Spacer 44 is formed utilizing the same or different process as used in forming the at least one spacer 26. Spacer 44 can be comprised of the same or different dielectric material as the at least one spacer 26. In one embodiment, spacer 44 is composed of a different dielectric material as compared to the at least one spacer 26. In one embodiment, spacer 44 is a spacer defining silicide proximity. Spacer 44 can be formed by a conventional silicide process and etching.

In some embodiments, and prior to the formation of spacer 44, the at least one spacer 26 can be removed and spacer 44 is formed in direct contact with sidewalls of the at least one FET gate stack 18. In the illustrated embodiment, a lateral edge of spacer 44 is in direct contact with a sidewall of the at least one spacer 26.

After formation of spacer 44, source/drain regions are formed into at least the second layer 36 of each of the pre-embedded stressor elements 33. The source/drain regions are formed utilizing a source/drain ion implantation process followed by annealing. Spacer 44 serves as an ion implantation mask.

Still referring to FIG. 4, a metal semiconductor alloy contact 45 is formed utilizing any process that is capable of converting the third layer 38 of the third epitaxy doped semiconductor material into a metal semiconductor alloy. It is noted that after this converting process an embedded stressor element 34 is provided that includes, from bottom to top, the first layer 35, the second layer 36 and the delta monolayer of dopant 37.

In one embodiment, the metal semiconductor alloy contact 45 is formed utilizing a silicide process. The silicide process can be self-aligned to the outer edge of the another spacer 44. The silicide process includes forming a metal capable of forming a metal semiconductor alloy when reacted with the third layer 38 of the third epitaxy doped semiconductor material. The metal used in forming the metal semiconductor alloy contact 45 can include, but is not limited to, tantalum, titanium, tungsten, ruthenium, cobalt, nickel, or any suitable combination of those materials. A diffusion barrier such as titanium nitride or tantalum nitride can be formed atop the metal. An anneal is performed that causes reaction between the metal and the underlying third layer of the third epitaxy doped semiconductor material forming metal semiconductor alloy contacts 45. It is observed that the metal semiconductor alloy contacts formed include a semiconductor material (as present in the third layer 38), a metal as defined above, and a dopant (as present in the third layer 38). Typically, the anneal is performed at a temperature of at least 250° C. or above. A single anneal step or multiple anneal steps can be used. Any non-reacted metal and the optional diffusion barrier are removed after the anneal has been performed. In some embodiments, a metal semiconductor alloy contact can be formed directly atop the gate electrode 22, when the optional gate electrode cap 24 is removed and the gate electrode 22 is composed of a Si-containing material.

Figure 5:
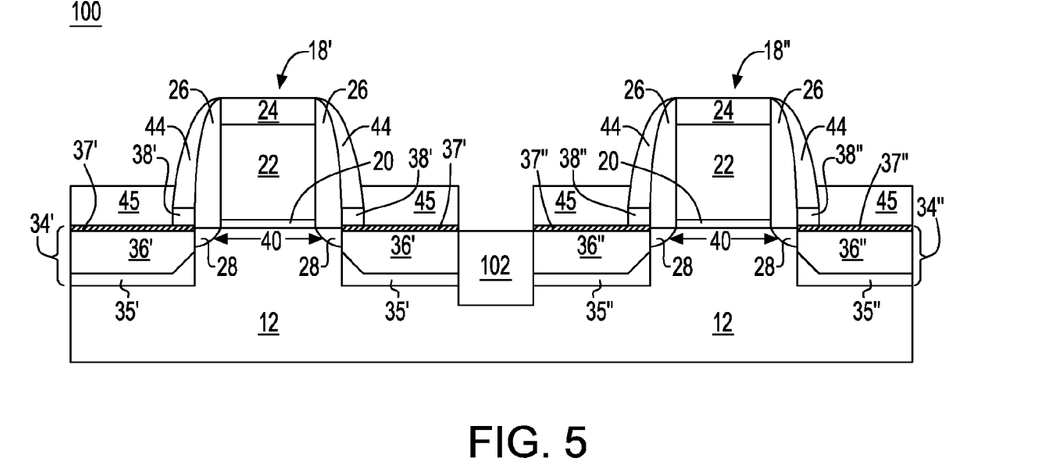
FIG. 5 is a pictorial representation (through a cross sectional view) depicting a CMOS structure that can be formed by employing the basic processing steps shown in FIGS. 1-4.

Reference is now made to FIG. 5 which illustrates a CMOS structure 100 that can be formed utilizing the basic processing steps mentioned above. Specifically, the CMOS structure 100 illustrated in FIG. 5 includes at least one pFET gate stack 18' and at least one nFET gate stack 18" located on an upper surface of a semiconductor substrate 12. An isolation region 102 is present between the at least one pFET gate stack 18' and the at least one nFET gate stack 18".

Each of the at least one pFET gate stack 18' and the at least one nFET gate stack 18" includes a gate dielectric 20, a gate electrode 22 and an optional dielectric cap 24 as mentioned above. Spacers 26 can also be present on sidewalls of each of the gate stacks. Each of the FET gate stacks further includes a source extension region and a drain extension region (collectively referred to as extension regions 28) located within the semiconductor substrate 12 at a footprint of both the at least one pFET gate stack 18' and the at least one nFET gate stack 18". A device channel 40 is located between the extension regions 28 of each of the FET gate stacks. pFET embedded stressor elements 34' are located on opposite sides of the at least one pFET gate stack 18' and within the semiconductor substrate 12, and nFET embedded stressor elements 34" are located on opposite sides of the at least one nFET gate stack 18" and within the semiconductor substrate 12. Each of the embedded stressor elements includes a first layer (35', 35") of a first epitaxy doped semiconductor material having a lattice constant that is different from a lattice constant of the semiconductor substrate 12 and imparts a strain in the device channel 40, and an second layer (36', 36") of a second epitaxy doped semiconductor material located atop the first layer, wherein the first layer of the first epitaxy doped semiconductor material has a lower content of dopant as compared to the second layer of the second epitaxy doped semiconductor material. Each embedded stressor element also includes a monolayer of dopant (37', 37") that is located on an upper surface of the second layer (36', 36") of each embedded stressor element. A metal semiconductor alloy 45 is present atop the at least one monolayer of dopants (37', 37") in each of the device regions. The structure shown in FIG. 5 also shows the presence of another spacer 44. The another spacer 44 is located atop a portion of the third layer (38' and 38") that remains in the structure.

It is emphasized that the presence of the delta monolayer between the metal semiconductor alloy and the second layer of the embedded stressor element significantly improves the overall contact resistance of the semiconductor structure compared with a semiconductor structure in which a delta monolayer of dopant is not present between an upper layer of an embedded stressor element and an overlying metal semiconductor alloy contact. Since the overall contact resistance is improved the structures of this disclosure exhibit better performance as compared to prior art structures not including the delta monolayer of dopant between the metal semiconductor alloy contact and the upper layer of the embedded stressor element. Also, since the delta monolayer disclosed herein is thin, the presence of the same does not alter the strain characteristics to the device channel.

Moreover, since the dopants within the delta monolayer are not consumed during the above processing steps no silicide piping is observed. As such, the process mentioned in this disclosures improves the device yield.

In some embodiments, improved channel strain (compressive) is achieved because the metal semiconductor alloy (tensile) is above and away from the device channel.

Also, since the metal semiconductor alloy contacts are raised relative to the initial surface of the substrate, the raised metal semiconductor alloy contact provides improved device performance.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A semiconductor structure comprising:
   at least one FET gate stack located on an upper surface of a semiconductor substrate, the at least one FET gate stack including a source extension region and a drain extension region located within the semiconductor substrate at a footprint of the at least one FET gate stack, and a device channel located between the source extension region and the drain extension region and beneath the at least one gate stack;
   embedded stressor elements located on opposite sides of the at least one FET gate stack and within the semiconductor substrate, wherein each embedded stressor element includes, from bottom to top, a first layer of a first epitaxy doped semiconductor material having a lattice constant that is different from a lattice constant of the semiconductor substrate and imparts a strain in the device channel, a second layer of a second epitaxy doped semiconductor material located atop the first layer, wherein the first layer of the first epitaxy doped semiconductor material has a lower content of dopant as compared to the second layer of the second epitaxy doped semiconductor material, and a delta monolayer of dopant located on the upper surface of the second layer of the second epitaxy dopant semiconductor material; and
   a metal semiconductor alloy located on an upper surface of the delta monolayer of dopant.

2. The semiconductor structure of claim 1 wherein the semiconductor substrate is bulk Si or a silicon-on-insulator.

3. The semiconductor structure of claim 1 wherein the at least one FET gate stack is a pFET gate stack, and wherein the first layer of each embedded stressor element includes SiGe or SiGe:C.

4. The semiconductor structure of claim 1 wherein the at least one FET gate stack is an nFET gate stack, and wherein the first layer of each embedded stressor element includes Si:C.

5. The semiconductor structure of claim 3 wherein the first and second epitaxy doped semiconductor materials include a p-type dopant and the delta monolayer of dopant is also p-type.

6. The semiconductor structure of claim 4 wherein the first and second epitaxy doped semiconductor materials include an n-type dopant and the delta monolayer of dopant is also n-type.

7. The semiconductor structure of claim 1 further comprising a silicide spacer that is located adjacent the at least one FET gate stack and atop a third layer of a third epitaxy doped semiconductor material.

8. A semiconductor structure comprising:
   at least one pFET gate stack and at least one nFET gate stack located on an upper surface of a semiconductor substrate, each of the at least one pFET gate stack and the at least one nFET gate stack includes a source extension region and a drain extension region located within the semiconductor substrate at a footprint of both the at least one pFET gate stack and the at least one nFET gate stack, and a device channel located between the source extension region and the drain extension region and beneath each of the gate stacks;
   pFET embedded stressor elements located on opposite sides of the at least one pFET gate stack and within the semiconductor substrate, and nFET embedded stressor elements located on opposite sides of the at least one nFET gate stack and within the semiconductor substrate, wherein each of the embedded stressor elements includes, from bottom to top, a first layer of a first epitaxy doped semiconductor material having a lattice constant that is different from a lattice constant of the semiconductor substrate and imparts a strain in the device channel, a second layer of a second epitaxy doped semiconductor material located atop the first layer, wherein the first layer of the first epitaxy doped semiconductor material has a lower content of dopant as compared to the second layer of the second epitaxy doped semiconductor material, and a monolayer of dopant located on an upper surface of the second layer of each of the embedded stressor elements; and
   a metal semiconductor alloy located on an upper surface of the delta monolayer of dopant.

9. The semiconductor structure of claim 8 wherein the first layer of each of the pFET embedded stressor elements includes SiGe or SiGe:C.

10. The semiconductor structure of claim 8 wherein the first layer of each of the nFET embedded stressor elements includes Si:C.

11. The semiconductor structure of claim 9 wherein the first and second epitaxy doped semiconductor materials of the pFET stressor elements include a p-type dopant and the monolayer of dopant is also p-type.

12. The semiconductor structure of claim 10 wherein the first and second epitaxy doped semiconductor materials of the nFET stressor elements include an n-type dopant and the monolayer of dopant is also n-type.

13. The semiconductor structure of claim 9 further comprising a silicide spacer that is located adjacent each of FET gate stacks and atop a third layer of a third epitaxy doped semiconductor material.

14. A method of fabricating a structure comprising:
forming at least one FET gate stack on an upper surface of a semiconductor substrate;
forming a source extension region and a drain extension region within the semiconductor substrate at the footprint of the at least one FET gate stack;
forming recessed regions on opposite sides of the at least one FET gate stack and within the semiconductor substrate;
forming pre-embedded stressor elements substantially within the recessed regions, wherein each of the pre-embedded stressor elements includes, from bottom to top, a first layer of a first epitaxy doped semiconductor material having a lattice constant that is different from a lattice constant of the semiconductor substrate and imparts a strain in the device channel, a second layer of a second epitaxy doped semiconductor material located atop the first layer, wherein the first layer of the first epitaxy doped semiconductor material has a lower content of dopant as compared to the second layer of the second epitaxy doped semiconductor material, a delta monolayer of dopant located on an upper surface of the second layer, and a third layer of epitaxy doped semiconductor layer located atop the delta monolayer; and
converting a portion of the third layer of the pre-embedded stressor element into a metal semiconductor alloy contact, wherein said metal semiconductor alloy contact is located directly an upper surface of the delta monolayer.

15. The method of claim 14 wherein the first, second and third layers of each pre-embedded stressor element are formed by an in-situ doped epitaxial growth process.

16. The method of claim 14 wherein the delta monolayer of dopant is formed by atomic layer deposition, the atomic layer deposition occurs by interrupting growth of the second layer of the second epitaxy doped semiconductor material.

17. The method of claim 14 wherein said converting includes a silicidation process.

18. The method of claim 14 wherein the at least one FET gate stack is a pFET gate stack, the first layer of each of the embedded stressor elements includes SiGe or SiGe:C, the first and second epitaxy doped semiconductor materials include a p-type dopant, and the delta monolayer of dopant includes a p-type dopant.

19. The method of claim 14 wherein the at least one FET gate stack is an nFET gate stack, the first layer of each of the embedded stressor elements includes Si:C, the first and second epitaxy doped semiconductor materials include an n-type dopant, and the delta monolayer of dopant includes an n-type dopant.

20. The method of claim 14 further comprising forming a silicide spacer adjacent to said at least one gate stack, wherein a bottom surface of said silicide spacer is located atop a remaining portion of the third layer of the third epitaxy doped semiconductor material, said silicide spacer is formed prior to said converting.

* * * * *